United States Patent [19]

Pearson et al.

[11] Patent Number: 4,766,532
[45] Date of Patent: Aug. 23, 1988

[54] SEQUENTIAL ARRAY LOGIC

[75] Inventors: Kenneth A. Pearson, Kingston; Larry R. Zucker, Saugerties, both of N.Y.

[73] Assignee: International Business Machines Corporation, Armonk, N.Y.

[21] Appl. No.: 728,719

[22] Filed: Apr. 30, 1985

[51] Int. Cl.[4] .......................................... G06F 12/00
[52] U.S. Cl. ................................................ 364/200
[58] Field of Search ... 364/200 MS File, 900 MS File; 307/465

[56] References Cited

U.S. PATENT DOCUMENTS

| | | | |
|---|---|---|---|
| 3,983,538 | 9/1976 | Jones | 364/900 |
| 4,237,542 | 12/1980 | Cukier | 364/900 |
| 4,336,601 | 6/1982 | Tanaka | 364/900 |
| 4,348,737 | 9/1982 | Cukier et al. | 364/900 |
| 4,357,678 | 11/1982 | Davis | 364/900 |

OTHER PUBLICATIONS

Ho, I., "Array Logic With Random-Access Memory", IBM Tech. Disclosure Bull., vol. 17, No. 10, Mar. 1975, pp. 2867-2869.
Clare, C. "Designing Logic Systems Using State Machines", 1973, pp. 75-95.

Primary Examiner—Thomas M. Heckler
Attorney, Agent, or Firm—Robert L. Troike; George E. Clark

[57] ABSTRACT

A programmable, sequential logic array for performing logical operations within a memory array, including an input storage array having addressable locations for storing input control words, input means for receiving a plurality of input signals and control words from the input storage array and producing signals indicating the relationship between conditions of the input signals and conditions represented by the control words, output means for providing binary output signals, an output storage array having addressable locations for storing output control words for controlling a state of the output means, a next address storage array for identifying a next address from one of a plurality of fields within the next address array, address generation means for receiving address signals from the next address storage array and for applying the address signals to address circuits of the input storage array, the output storage array, and the next address storage array, coding means for coding status of lines comprising an input/output interface for selectively ignoring predetermined status conditions, control means connecting the input means to the output means and responsive to signals produced by the input means to enable the output means to respond to selected output control words to selectively change outputs, and a subroutine control random access storage array for providing signals to the control means to control execution of subroutines.

7 Claims, 5 Drawing Sheets

SEQUENTIAL ARRAY LOGIC

SEQUENTIAL ARRAY LOGIC

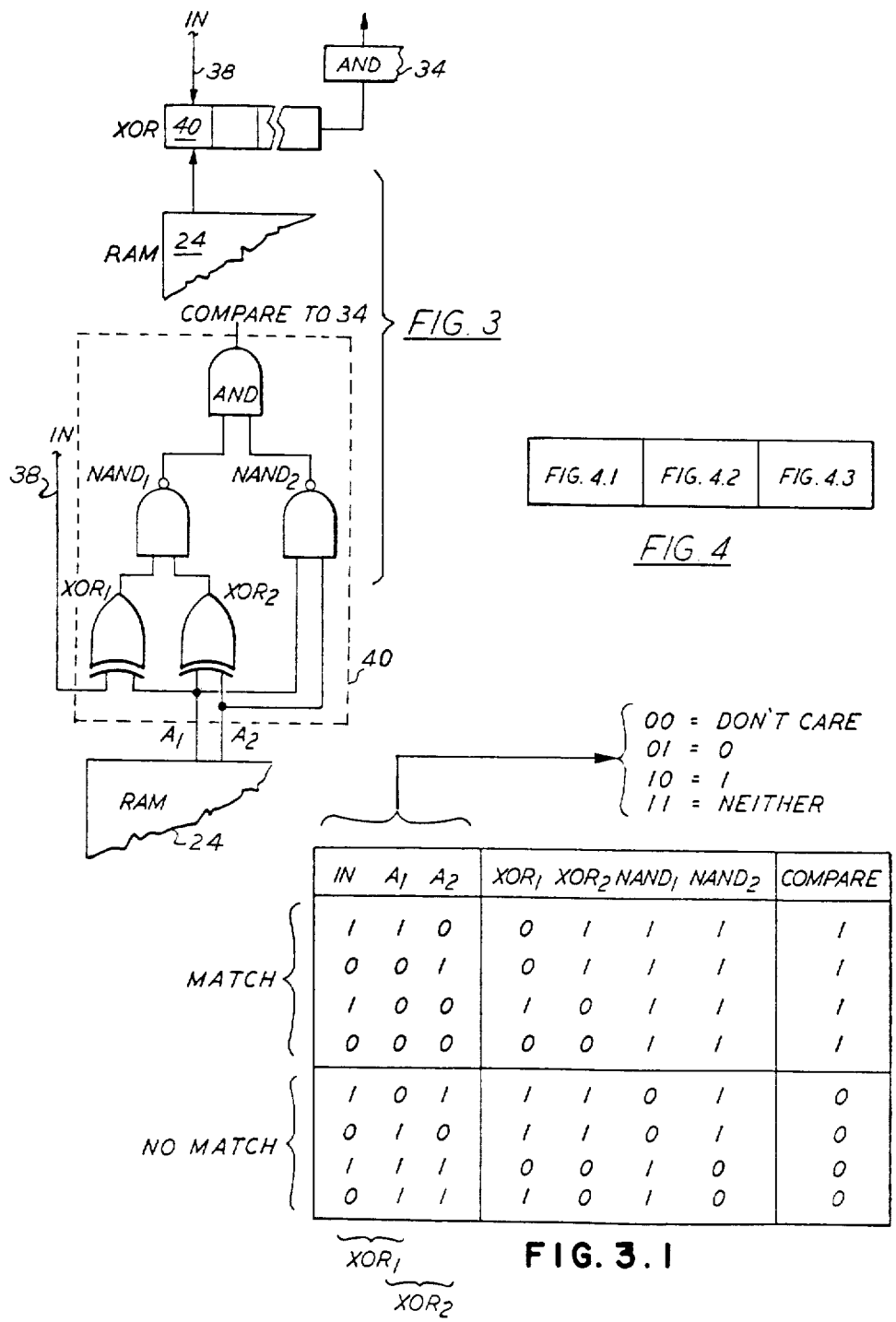

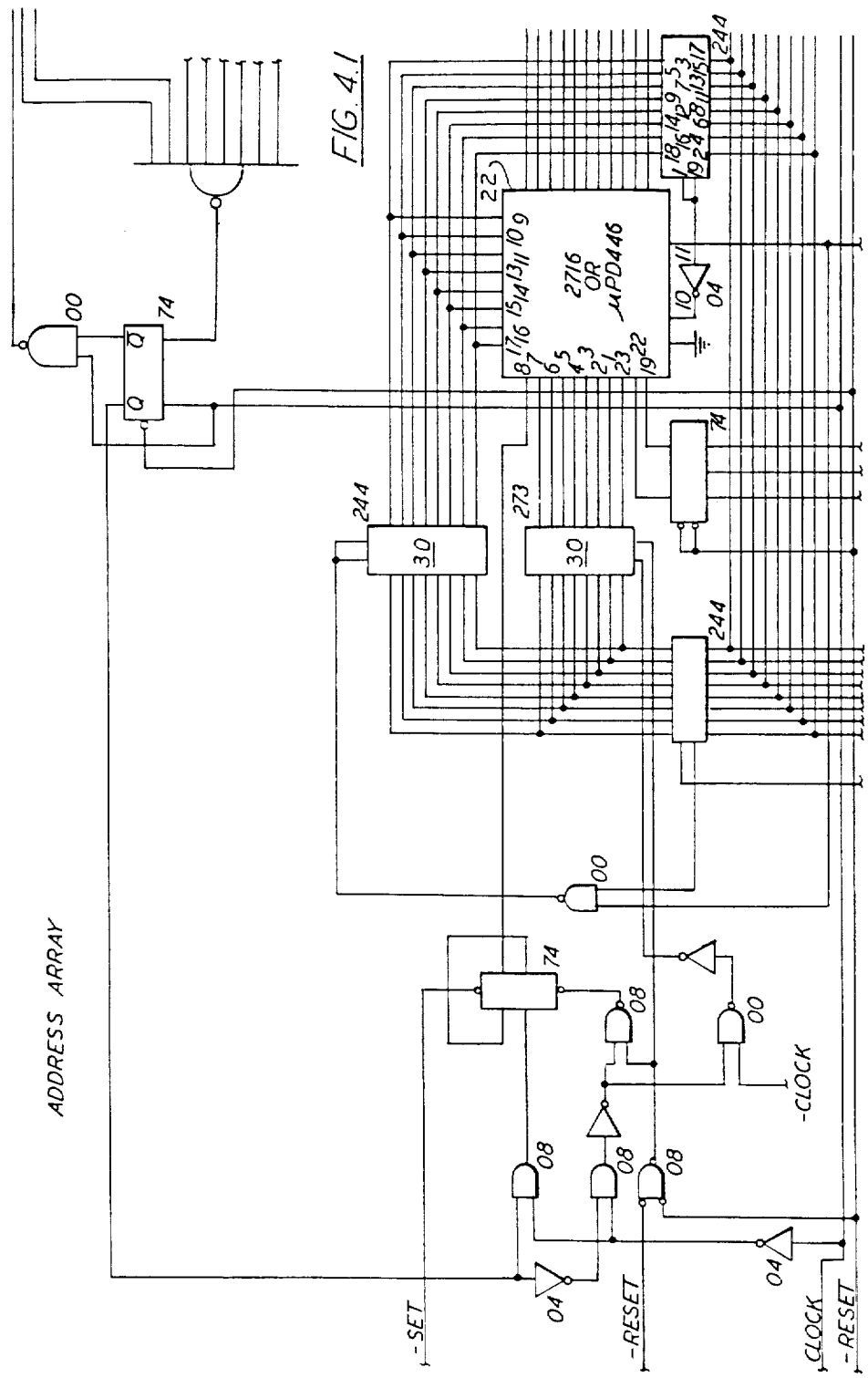

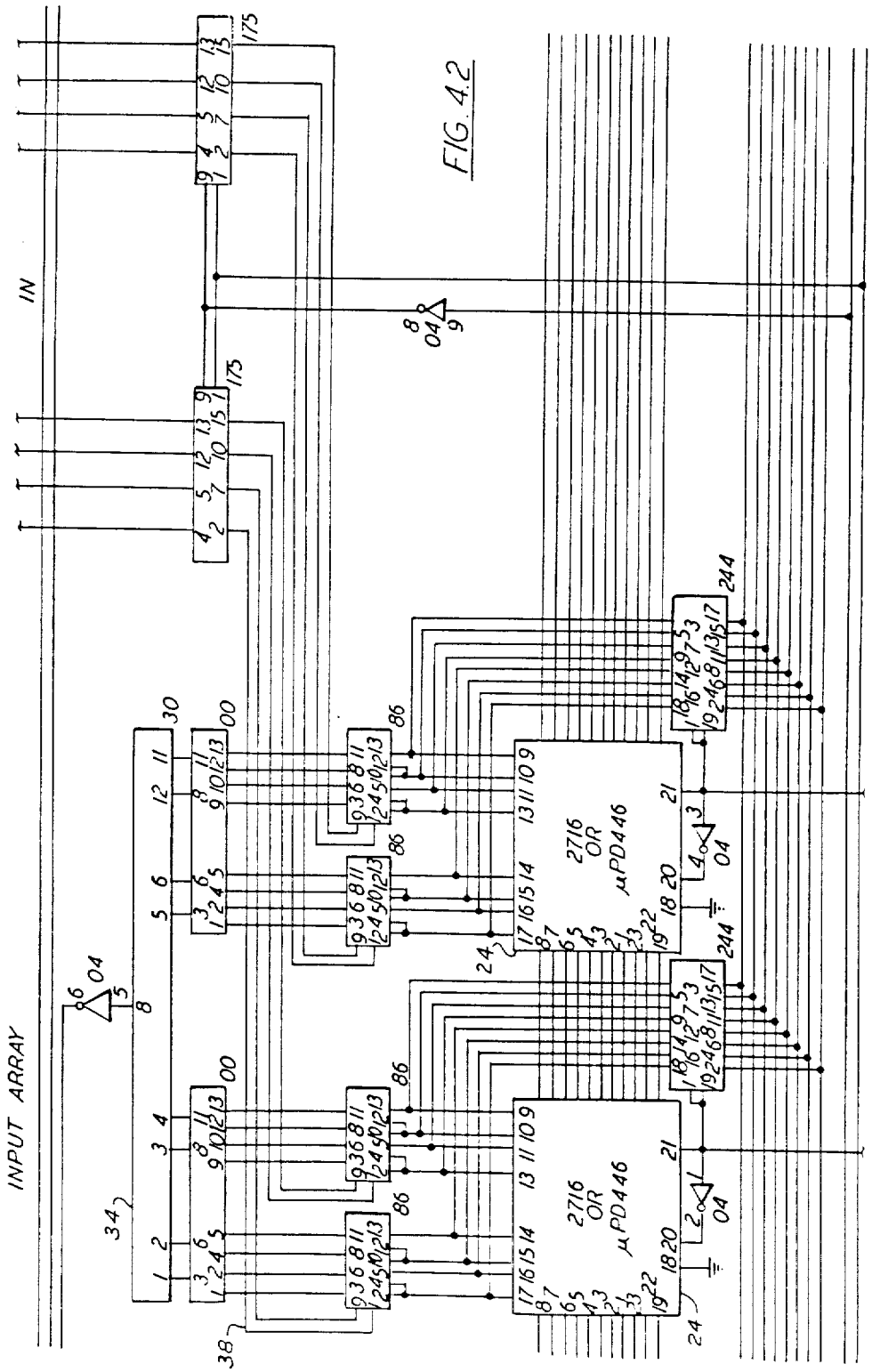
FIG. 4.2

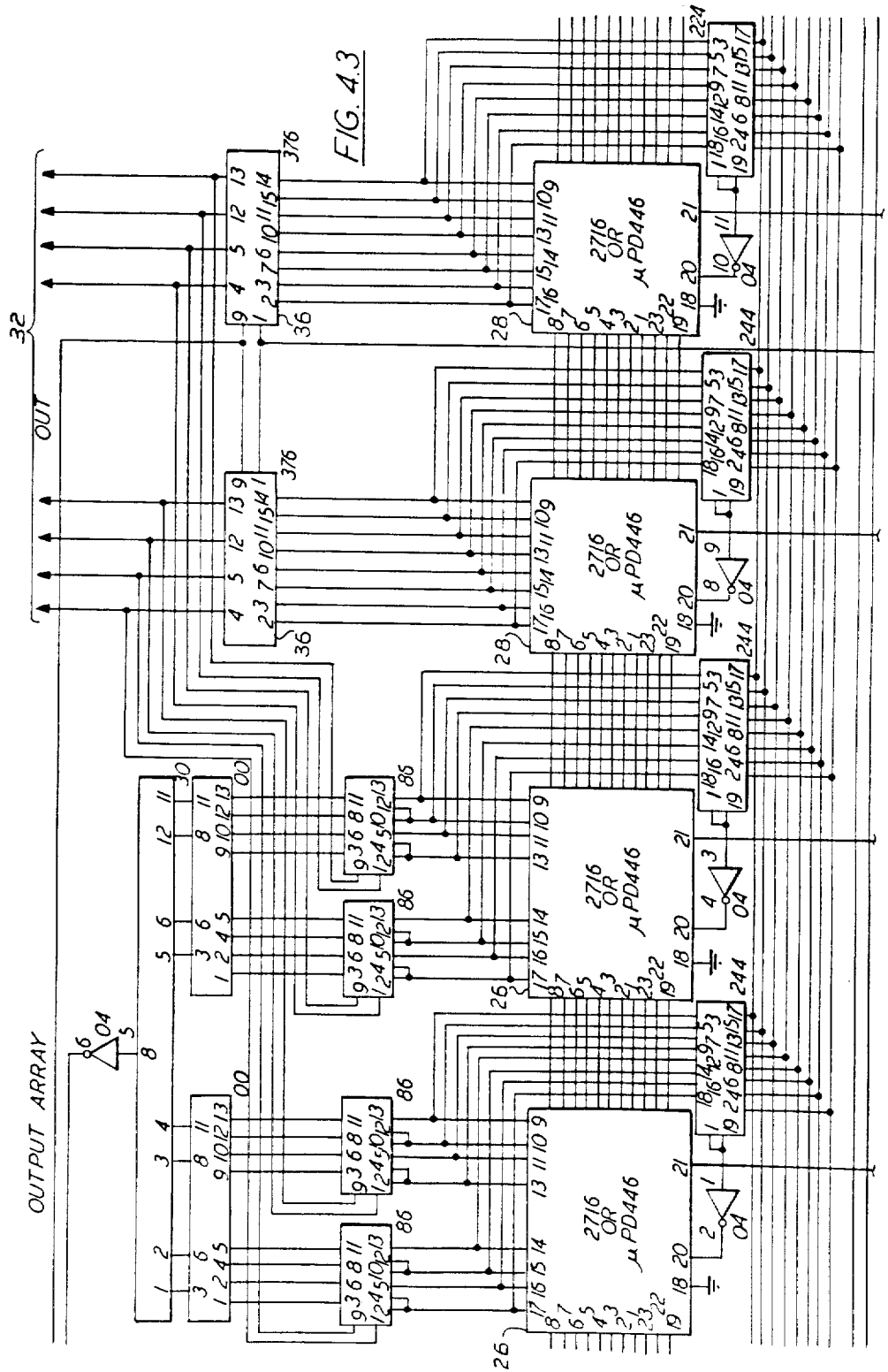

SEQUENTIAL ARRAY LOGIC

BACKGROUND OF THE INVENTION

The present invention relates to digital logic circuits and more particularly to programmable logic arrays implemented in storage devices such as random access memories.

DESCRIPTION OF THE PRIOR ART

The following are systems representative of the prior art.

U.S. Pat. No. 4,357,678 employs a random access memory for performing logic functions. However, the patent requires the entire array to be searched sequentially on each functional cycle which slows the operation considerably. Further, the patent teaches a system which multiplexes inputs and outputs and does not provide for logic controlled feedback from output to input.

U.S. Pat. No. 4,348,737 includes a random access memory array for performing logic functions which requires an entire array to be searched sequentially once every functional cycle as does the U.S. Pat. No. 4,357,678 described above.

The logic array according to the present invention does not require a search of the entire array for each cycle as does the patent and thus the array of the present invention provides a much faster operation.

IBM Technical Disclosure Bulletin, Volume 17, Number 10, March, 1975, page 2867, describes array logic implemented with random access memory with a feedback system where the outputs directly generate the next address to be accessed in the RAM. The article describes an array logic RAM which is very restricted in its operation and does not provide the flexibility which is provided by the logic array of the present invention.

U.S. Pat. No. 4,336,601 describes a rewritable program logic array which is dynamically alterable during processing by loading a work pattern of bit personalities to realize specific logic functions into memory cells of current mode logic by splitting a conventional RAM of current mode logic into two parts, a seach part and a read part. The logic in memory for the AND functions on the array can be conducted by using one of multi-emitters of a transitor in each current mode logic memory cell and an emitter of a referenced transistor in each of the sense drive circuits in the read mode of the rewritable program logic array.

The structure according to the patent requires a specific technology, namely CML, to implement the logic in memory functions whereas, such specific technology is not required by embodiments of the present invention.

U.S. Pat. No. 4,237,542 shows a programmable logic array of the well-know type which does not employ a random access memory for implementation as does the array in accordance with the present invention.

U.S. Pat. No. 3,818,452 describes a fusible link programmable logic array for use in designing digital systems. The patent does not teach the use of a random access memory to perform logic functions as does the circuit according to the present invention.

U.S. Pat. No. 3,829,846 describes a multi-function logic module employing read only associative memory arrays. The logic system of the patent does not show the use of random access memories as does the circuit of the present invention.

CLARE, "Designing Logic Systems Using State Machines", 1973; McGraw-Hill Book Company, at pages 76-90, describes a programmable logic structure implemented in a random access memory.

However, the various structures shown by CLARE are limited in application in that feedback between output and input must be hard wired for specific functions as compared to the feedback system of the present invention which is implemented by a feedback array. Further, the CLARE structure does not permit subroutines to be implemented as does the present invention. Additionally, Clare avoids the use of "don't care" conditions on inputs and "don't change" conditions on outputs by limiting operation to one (1) input line per state. That is, Clare sorts multiple simultaneous inputs with a hardware data selector and has no way of assuring that those input lines already tested, are still in the same state. Clare ignores inputs by selecting a 'tied' input and treats outputs as full-width outputs without the ability to selectively change the outputs.

Although the prior art shows similar functions and use of random access memory to implement program logic arrays, none of the prior neither individually or in any combination thereof teaches the present invention as claimed herein.

SUMMARY OF THE INVENTION

Therefore, it is a primary object of the present invention to efficiently implement programmable logic arrays in a system including an input/output signal interface, a multiple field storage array, an address means for the array responsive to a current address, a first compare means for comparing input signals with the interface with a first field in the storage array accessed by the current address, a second compare means for comparing output signals at the interface with a second field of the storage array accessed by the current address, a coding means for coding the status of lines comprising the input/output interface for selectively ignoring predetermined status conditions and gating means responsive to the detection of a predetermined comparison relationship by either the first means or the second means for gating the second field information across the interface and for gating a third field to an addressing means for addressing a next address in the storage array.

Accordingly, a programmable, sequential logic array for performing logical operations within a memory array, includes an input storage array having addressable locations for storing input control words, input means for receiving a plurality of input signals and control words from the input storage array and producing signals indicating the relationship between conditions of the input signals and conditions represented by the control words, output means for providing binary output signals, an output storage array having addressable locations for storing output control words for controlling a state of the output means, a next address storage array for identifying a next address from one of a plurality of fields within the next address array, address generation means for receiving address signals from the next address storage array and for applying the address signals to address circuits of the input storage array, the output storage array, and the next address storage array, control means connecting the input means to the output means and responsive to signals produced by the input means to enable the output means to respond to selected output control words, and a subroutine control random access storage array for providing signals to the control means to control execution of subroutines.

The foregoing and other objects, features and advantages of the invention will be apparent from the more particular description of the preferred embodiments of the invention, as illustrated in the accompanying drawing.

BRIEF DESCRIPTION OF THE DRAWING

FIG. 3 is a logic diagram of interface gating means according to the present invention.

FIG. 3.1 is a table showing the relationships between the inputs and outputs of the compare means and interface gating means of FIG. 3.

FIG. 4 is a diagram showing the relationship of FIGS. 4.1, 4.2, and 4.3.

FIG. 4.1 is a logic diagram of a first portion of a preferred embodiment of the logic system in accordance with the present invention.

FIG. 4.2 is a logic diagram of a second portion of a preferred embodiment of the logic system in accordance with the present invention.

FIG. 4.3 is a logic diagram of a third portion of a preferred embodiment of the logic system in accordance with the present invention.

In the drawing, like elements are designated with similar reference numbers, and identical elements in different specific embodiments are designated by identical reference numbers.

PRIOR ART

Figure 1:
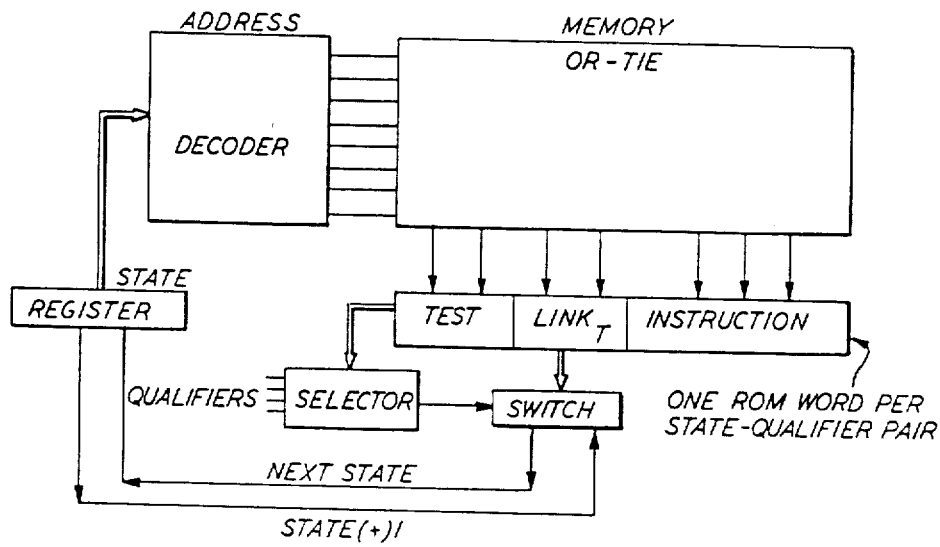
FIG. 1 is a block diagram of a prior art programmable logic array implemented by in combination of random access memory and to read only storage.

An example of a prior art logic array is shown in FIG. 1. The prior art system has a next address array including A and B portions and an output array including A and B portions in which one of a number of next addresses and outputs, either A or B, can be selected according to an arbitrary combinatorial function of the inputs selected by a select input field from the array. The prior art system includes a read only storage for storing a code to select inputs whereas, the feedback array of the present invention stores reference conditions for comparison with input and output feedback lines.

DESCRIPTION OF A PREFERRED EMBODIMENT OF THE INVENTION

A random access memory array is adapted to perform the functions of a programmable logic array.

Figure 2:
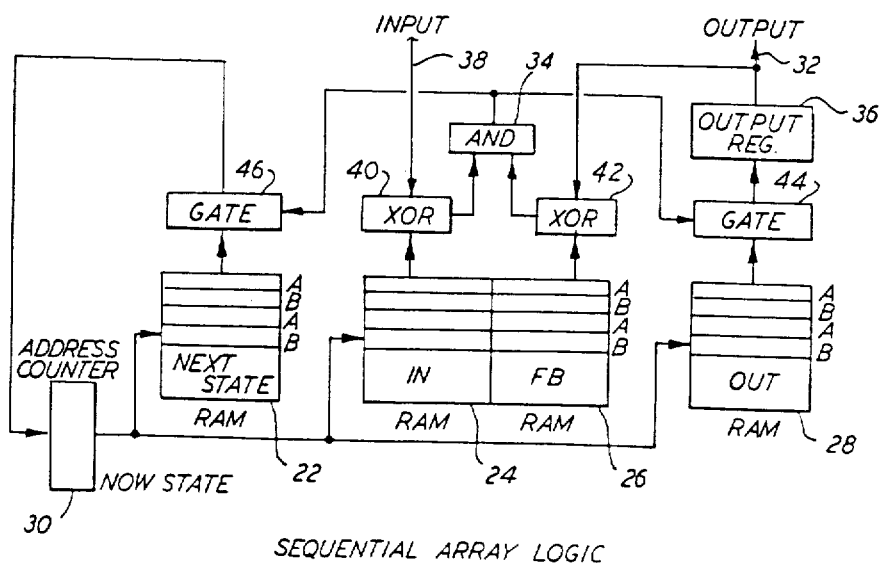
FIG. 2 is a block diagram of a programmable logic system according to the present invention.

FIG. 2 is a block diagram of sequential array logic according to the present invention.

Four RAM arrays 22, 24, 26, and 28, are all addressed in parallel by an output from address counter 30. The contents of the four arrays 22, 24, 26, and 28 are read out corresponding to the address contained in address counter 30.

A functional cycle from input to output is comprised of two parts. First, the READ of the contents pointed to by the address counter 30 and then, conditionally, the READ of the next consecutive address from next state array 22. The next state array is divided into two portions A and B, where the A portion of the array stores a next address corresponding to a compare on an A portion of a cycle and the B portion of the array stores a next address corresponding to a compare on a B portion of a cycle.

During the A portion of a cycle, the contents of input array 24 at location A are compared with input lines 38 bit by bit by exclusive OR (XOR) 40. If a true compare exists, and if the contents of feedback array 26 compare bit by bit with the output on lines 32, XOR 42 produces a true signal to AND gate 34. AND gate 34 produces an output which gates two data paths. The contents of location A in output array 28 are gated to output register 36 by gates 44, and the contents of location A in the next state array 22 are gated by gates 46 to address counter 30. This results in the four arrays, 22, 24, 26 and 28 being addressed at the A portion of a new current state.

If there was no compare on either the input from lines 38 or feedback on lines 32, the address counter 30 is incremented by one so that the B portion of the arrays 22, 24, 26 and 28 are selected. A compare on both input and feedback results in the B data being transferred to the output 32 and address counter 30. If there is no compare on the B cycle, address counter is decremented by one and another A-B cycle is started at the same address location. This means that the current state remains unchanged until a compare occurs on subsequent A-B cycle, and this depends on changes to the input on lines 38.

The compare is shown in detail in FIG. 3 and accompanying FIG. 3.1. Two bits, A1 and A2, are used in the input array 24 and feedback array 26 to represent one functional bit as shown in FIG. 3.1.

FIG. 3.1 describes the coding means of the present invention which selectively ignores a predetermined status condition represented by code 00 for bits A1 and A2, and which represents code 01 as 0, code 10 as 1, and code 11 as neither for A and B in parallel to force a 'no compare' on A or B or both.

Two bits are also used in output array 28 to change one functional output bit according to the following Table 1:

TABLE 1

00=no change
01=clear
10=set
11=toggle

The result of the operation is that outputs can be made to change in response to inputs, in the same way as is done in a program logic array, and in a worst case time interval twice the cycle time of the random access memory or erasable programmable read only memory used, which are nominally in the 70–300 nano-second range. The response time can be reduced to one array cycle if the number of arrays is doubled, allowing the A and B data to be in separate arrays.

The detailed logic of the preferred embodiment of the present invention as described with reference to FIG. 2 is shown in FIGS. 4.1, 4.2, and 4.3. FIGS. 4.1, 4.2, and 4.3 contain specific component and interconnection information and provide sufficient detail to enable a person skilled in the art to reproduce a logic system in accordance with the present invention.

Thus, while the invention has been described with reference to preferred embodiments thereof, it will be understood by those skilled in the art that various changes in form and details may be made without departing from the scope of the invention.

What is claimed is:

1. A programmable sequential logic array for performing logical operations within a memory array, comprising:
   an input storage array having addressable locations for storing input control words;
   input compare means for receiving a plurality of input signals and a plurality of input control words from said input storage array and producing signals indicating the relationship between conditions of said input signals and conditions represented by said input control words;
   output means for providing binary output signals representative of the logic function performed by such programmable sequential logic array;
   an output storage array having addressable locations for storing output control words for controlling a state of said output means;
   a next state array for identifying a next address from one of a plurality of fields within said next state array;
   a feedback storage array having addressable locations for storing control words for comparison with said binary output signals;
   address generation means for receiving address signals from said next state array and for applying said address signals to address circuits of said input storage array, said output storage array, said feedback storage array, and said next state array; and
   control means connected between said input means, said output means, said feedback storage array and said next state array and responsive to said input signals, said output signals and said control words stored in said input storage array and said feedback storage array to enable said output means to respond to selected output control words.

2. A programmable, sequential logic array according to claim 1, further comprising:
   condition detection gate means responsive to a first means for comparing said input signals with a first field of an address accessed by said address generation means as a current address, and a second means for comparing output signals with a second field of an address accessed by said address generation means as said current address for modifying said current address according to a predetermined algorithm on the detection of predetermined conditions of outputs of said first and second means.

3. A programmable, sequential logic array according to claim 1, wherein said input compare means includes means for comparing said input signals with preselected plurality of bits of said input control words for producing a multiplicity of compare signals each of which is derived from a single input signal and said preselected plurality of bits of said input control word.

4. A self sequencing logic circuit responsive to external signal conditions, comprising:
   means for receiving multi-bit binary input signals;
   register means for presenting multi-bit binary output signals;
   a multiple field storage array;
   a current address driven address means for said array;
   first means for comparing said input signals with a first field accessed by said address means by said current address;
   second means for comparing said output signals with a second field accessed by said address means for said current address;
   and gate means responsive to detection of a predetermined comparison relationship by either said first means or said second means for gating said second field to said register means.

5. A logic circuit according to claim 4, further comprising condition detection gate means responsive to said first and second compare means for modifying said current address according to a predetermined algorithm on the detection of predetermined conditions of outputs of said first and second compare means.

6. A logic circuit according to claim 4, wherein said first means for comparing includes means for comparing said input signals with preselected plurality of bits accessed by said address means for producing a multiplicity of compare signals, each of which is derived from a single input signal and said preselected plurality of bits.

7. A self-sequencing logic circuit including an address generating means effective to generate a new address by selecting one of a predetermined set of potential new addresses, and an output storage array accessed by said generated addresses and an output register, characterized in that said logic circuit further comprises;
   control gating means between said output array and said output register;
   means for providing multi-bit binary input signals, independent of outputs from said register, to said address generating means; and
   feedback means for enabling feedback signals from said output register to said address generating means, said address generating means including an input storage array for storing expected input control words, a feedback array for storing expected output control words from said output register, next address array generating a new address by selecting one of a predetermined set of potential new addresses, a loadable counter, and compare logic,
   said compare logic responsive to said multi-bit binary input signals, said feedback signals from said output register, said expected input control words and said expected output control words for if there is a comparison of said multi-bit binary input signals with said expected input control words and said feedback signals from said output register with expected output control words from said feedback array gating out the next address from the next address array to said loadable counter and changing the values in the output register to the value at said output storage array and if there is not a comparison incrementing the loadable counter.

* * * * *